(12) United States Patent
Hamparian

(10) Patent No.: US 8,335,542 B2
(45) Date of Patent: Dec. 18, 2012

(54) RECONFIGURABLE WIRELESS TRANSMISSION SYSTEM

(75) Inventor: Simon Hamparian, Emerson, NJ (US)

(73) Assignee: Andrew LLC, Hickory, NC (US)

( * ) Notice: Subject to any disclaimer, the term of this patent is extended or adjusted under 35 U.S.C. 154(b) by 335 days.

(21) Appl. No.: 12/757,223

(22) Filed: Apr. 9, 2010

(65) Prior Publication Data

US 2011/0250854 A1    Oct. 13, 2011

(51) Int. Cl.
*H04B 1/02* (2006.01)
*H04M 1/00* (2006.01)

(52) U.S. Cl. ..................... 455/562.1; 455/103

(58) Field of Classification Search .............. 455/101, 455/103, 104, 105, 115.1, 126, 127.1, 127.3, 455/129, 562.1
See application file for complete search history.

(56) References Cited

U.S. PATENT DOCUMENTS

| | | | |
|---|---|---|---|
| 6,006,075 A * | 12/1999 | Smith et al. | 455/101 |
| 7,081,794 B2 | 7/2006 | Burke et al. | |
| 2004/0219889 A1 * | 11/2004 | Honcharenko | 455/91 |
| 2006/0030280 A1 * | 2/2006 | Anderson et al. | 455/101 |
| 2007/0135168 A1 * | 6/2007 | Liu | 455/562.1 |
| 2007/0290804 A1 * | 12/2007 | Komesu | 340/10.1 |
| 2011/0263215 A1 * | 10/2011 | Asplund et al. | 455/115.1 |

* cited by examiner

*Primary Examiner* — Blane J Jackson
(74) *Attorney, Agent, or Firm* — Mendelsohn, Drucker & Associates, P.C.; Steve Mendelsohn

(57) ABSTRACT

A wireless transmission system supporting at least first and second high-isolation transmission modes. In the first TX mode, first and second incoming data streams are processed independently within first and second TX paths to generate first and second analog outgoing signals for separate transmission via first and second antennas. In the second TX mode, the two incoming data streams are combined to form a combined data stream. First and second versions of the combined data stream are processed by the first and second TX paths to generate two analog signals that are combined for transmission via a single antenna. In the second TX mode, a feedback signal, based on differences between the two analog signals, is used to adjust the relative phase and/or delay of the two versions of the combined signal in the digital domain to reduce phase differences between the two analog signals, thereby increasing signal transmission power.

23 Claims, 3 Drawing Sheets

100

200

300

RECONFIGURABLE WIRELESS TRANSMISSION SYSTEM

BACKGROUND

1. Field of the Invention

The present invention relates to wireless transmission systems, and, in particular, to such systems that can be configured to operate in different transmission modes.

2. Description of the Related Art

This section introduces aspects that may help facilitate a better understanding of the invention. Accordingly, the statements of this section are to be read in this light and are not to be understood as admissions about what is prior art or what is not prior art.

A Butler matrix is a type of reconfigurable wireless transmission (TX) system that can be used to selectively transmit multiple input signals in different combinations via different combinations of multiple antennas. For example, a relatively simple (2×2) Butler matrix can be selectively configured in either a first TX mode, in which two input signals are independently transmitted via two antennas, or a second TX mode, in which the two input signals are combined for transmission via one of the two antennas. In a Butler matrix, the relative phase difference between the two input signals determines whether the two input signals will be transmitted in the first TX mode or the second TX mode.

In some transmission applications, such as those where the two input signals are to be independently transmitted in the first TX mode at two different frequencies, the isolation requirement between the two antennas is greater than can be achieved using a conventional Butler matrix.

SUMMARY

In one embodiment, the present invention is a reconfigurable wireless transmission system comprising a digital processor, first and second transmission paths, and a switching sub-system. The digital processor receives at least first and second incoming data streams and generates at least first and second outgoing data streams. The first transmission path receives the first outgoing data stream and generates a first analog output signal, while the second transmission path receives the second outgoing data stream and generates a second analog output signal. The switching sub-system enables the system to be configured in any one of at least first and second transmission modes. In the first transmission mode, the first analog output signal is transmitted via a first antenna and the second analog output signal is transmitted via a second antenna. In the second transmission mode, the first and second analog output signals are combined for transmission via the first antenna.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
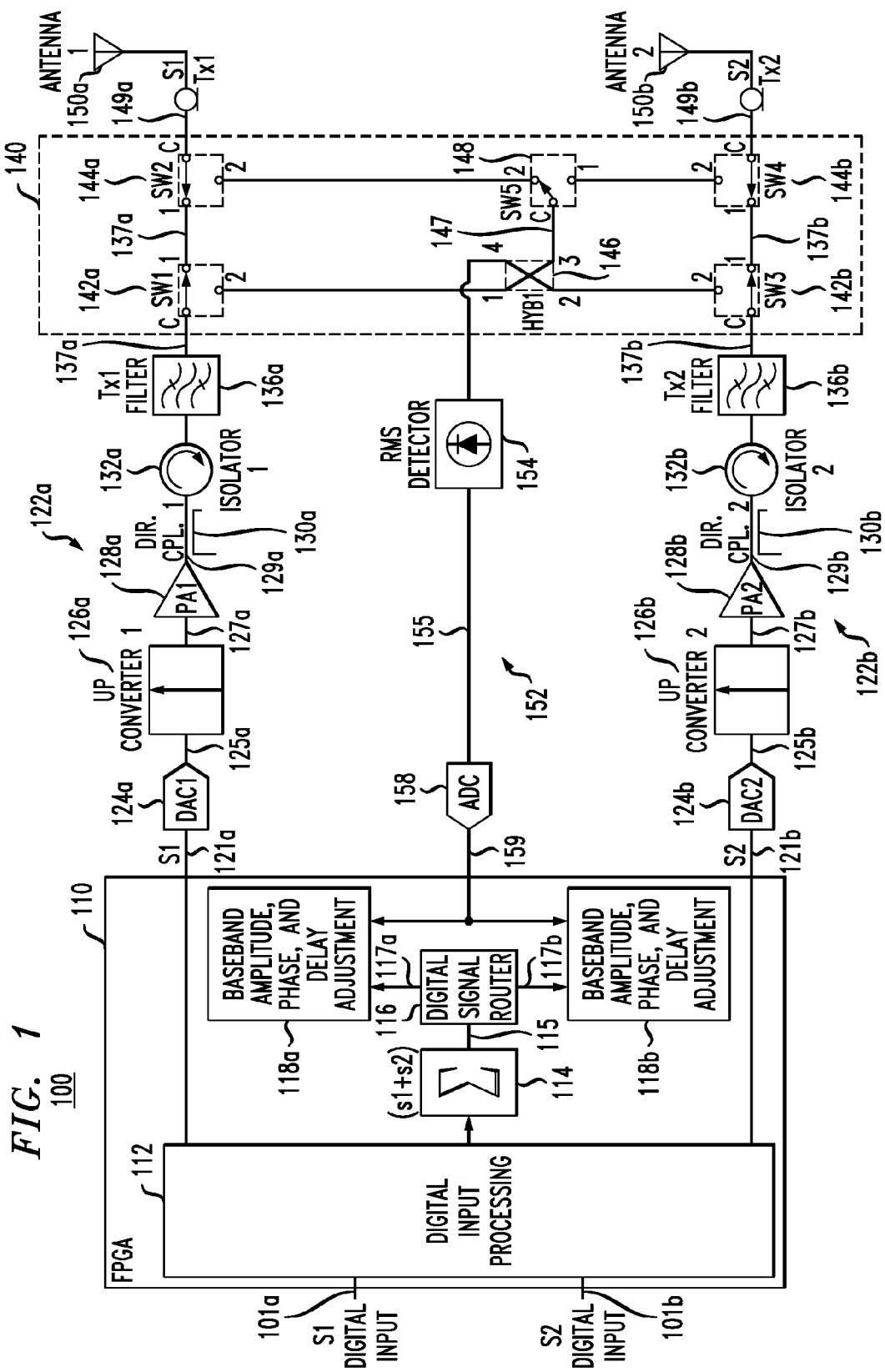
FIG. 1 shows a block diagram of a reconfigurable wireless transmission (TX) system configured to operate in a first TX mode.
Figure 2:
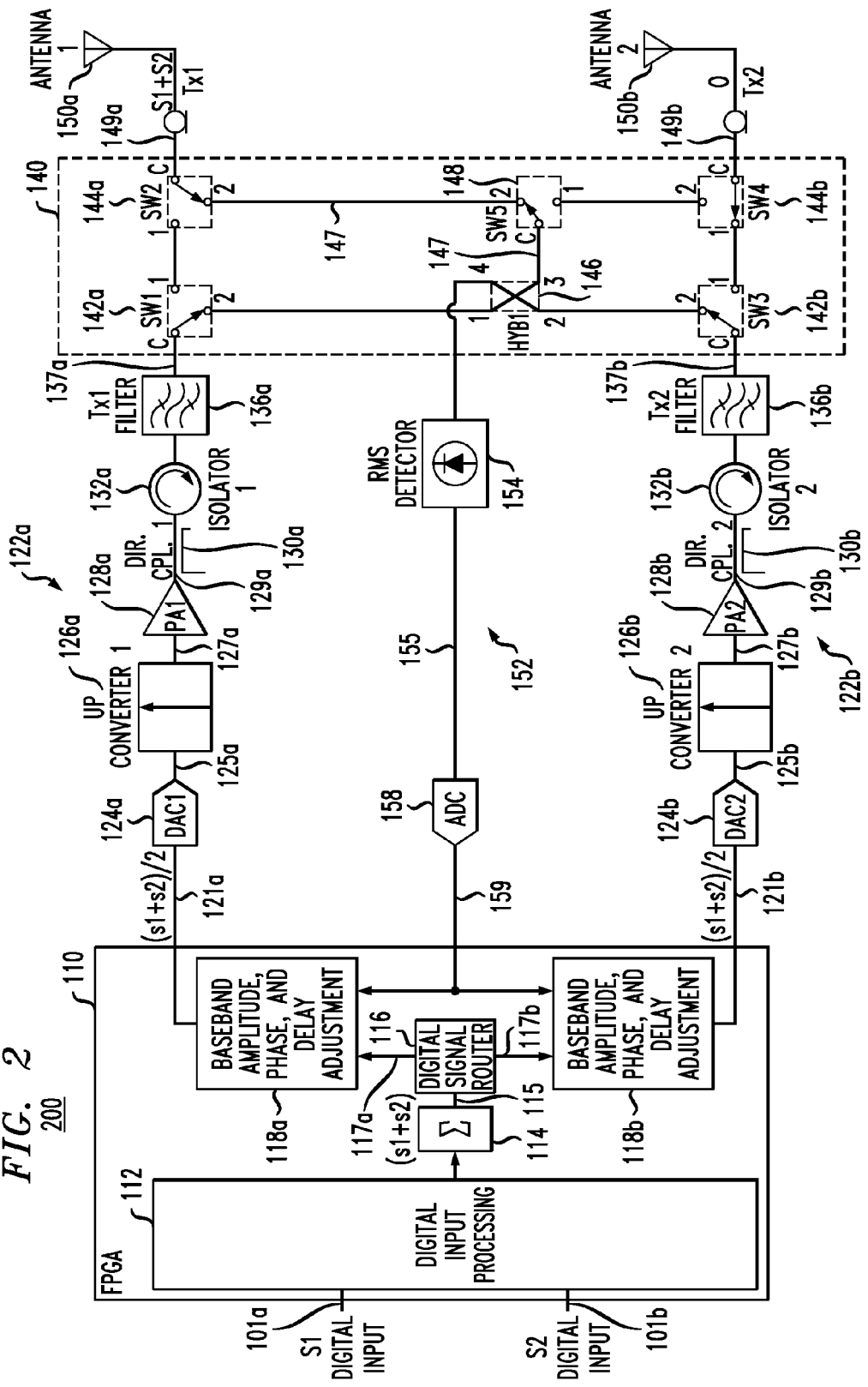
FIG. 2 shows a block diagram of the TX system of FIG. 1 configured to operate in a second TX mode.
Figure 3:
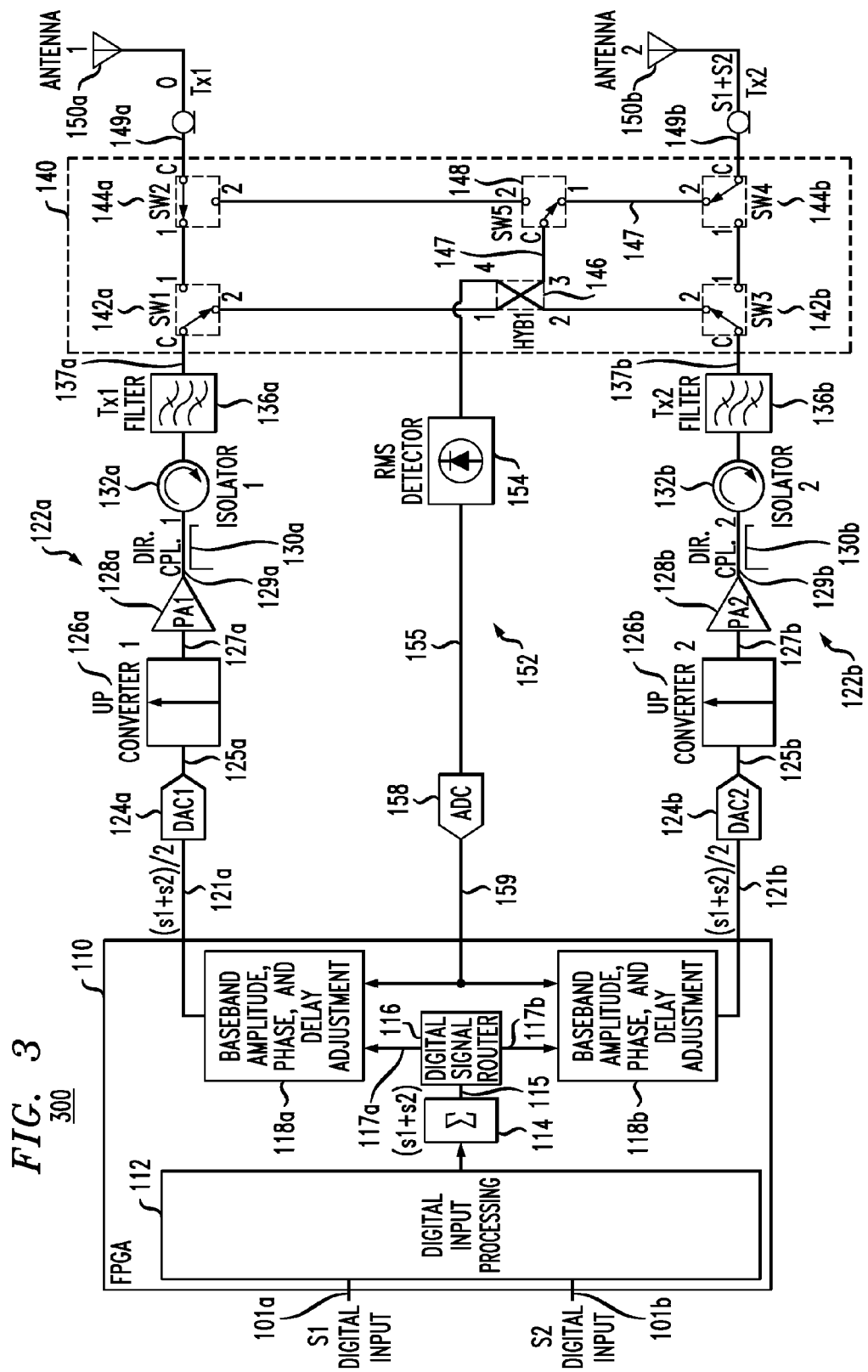
FIG. 3 shows a block diagram of the TX system of FIGS. 1 and 2 configured to operate in a third TX mode.

FIGS. 1-3 show block diagrams of different configurations of a reconfigurable wireless transmission (TX) system 100, according to one embodiment of the present invention. TX system 100 receives two incoming data streams 101*a/b* and, depending on the particular TX mode, generates one or two analog output signals 149*a/b* for transmission via one or two antennas 150*a/b*, respectively.

In particular, in a first TX mode represented in FIG. 1, the signal transmitted via first antenna 150*a* is based on first incoming data stream 101*a*, but independent of second incoming data stream 101*b*, while the signal transmitted via second antenna 150*b* is based on second incoming data stream 101*b*, but independent of first incoming data stream 101*a*. Depending on the particular application, those two transmitted signals can have the same or different frequencies.

In a second TX mode represented in FIG. 2, the signal transmitted via first antenna 150*a* is based on both the first and second incoming data streams 101*a/b*, and no signal is transmitted via second antenna 150*b*.

In a third TX mode represented in FIG. 3, the signal transmitted via second antenna 150*b* is based on both the first and second incoming data streams 101*a/b*, and no signal is transmitted via first antenna 150*a*.

As shown in FIGS. 1-3, TX system 100 includes a digital processor (e.g., a field-programmable gate array (FPGA) or other suitable processor) 110, first and second TX paths 122*a/b*, a switching sub-system 140, first and second antennas 150*a/b*, and a feedback path 152. Note that, as a commercialized product, TX system 100 can be sold with or without antennas 150*a/b*.

Digital processor 110 receives and processes first and second incoming (e.g., digital baseband) data streams 101*a/b* to generate first and second outgoing (e.g., digital baseband) data streams 121*a/b*. The processing of digital processor 110 will be further described below in the context of the three different TX modes.

First TX path 122*a* receives and processes first outgoing data stream 121*a* to generate first analog output signal 137*a*. In particular, digital-to-analog converter (DAC) 124 D-to-A converts first outgoing data stream 121*a* into first analog baseband signal 125*a*. Upconverter 126*a* unconverts first analog baseband signal 125*a* into first analog radio frequency (RF) signal 127*a*. First power amplifier (PA) 128*a* amplifies first analog RF signal 127*a* to generate amplified analog RF signal 129*a*. Directional coupler 130*a* samples the output of power amplifier 128*a* for digital pre-distortion linearization correction. Isolator 132*a* provides isolation between directional coupler 130*a* and TX filter 136*a* so that out-of-band input return loss of TX filter 136*a* does not degrade the digital pre-distortion linearization. First TX filter 136*a* band-pass filters amplified analog RF signal 129*a* to generate first analog output signal 137*a*.

Similarly, second TX path 122*b*, which contains analogous elements that perform analogous functions as first TX path 122*a*, receives and processes second outgoing data stream 121*b* to generate second analog output signal 137*b*. Note that, depending on the particular implementation, first and second upconverters 126*a* and 126*b* may generate first and second RF signals 127*a* and 127*b*, respectively, having the same frequency or two different RF frequencies.

Switching sub-system 140 receives first and second analog output signals 137a/b. Depending on the configuration of switching sub-system 140, which is based on the selected TX mode, switching sub-system 140 generates one or both of analog TX signals 149a/b for transmission via antennas 150a/b, respectively. The processing of switching sub-system 140 will be further described below in the context of the three different TX modes.

As shown in FIGS. 1-3, switching sub-system 140 has a combiner (e.g., a 3 dB quadrature hybrid or other suitable device) 146 and five switches. In particular, the five switches are (1×2) first switch (SW1) 142a, (2×1) second switch (SW2) 144a, (1×2) third switch (SW3) 142b, (2×1) fourth switch (SW4) 144a, and (1×2) fifth switch (SW5) 148. As understood, a (1×2) switch has a single input terminal and two output terminals and selectively presents a signal applied to the input terminal at one of the two output terminals, depending on the configuration (i.e., state) of the switch. On the other hand, a (2×1) switch has two input terminals and a single output terminal and selectively presents one of the two signals applied to the two input terminals at the output terminal, depending on the configuration of the switch.

Combiner 146 has first and second input ports 146-1 and 146-2, sum output port 146-3, and difference output port 146-4. As understood, analog sum signal 147 presented at sum output port 146-3 represents a sum of the two analog signals applied to first and second input ports 146-1 and 146-2, while analog difference signal 151 presented at difference output port 146-4 represents a difference between the two analog signals applied to first and second input ports 146-1 and 146-2.

Feedback path 152 converts analog difference signal 151 into digital feedback signal 159, which, as further described below, is used by digital processor 110 in (at least) the second and third TX modes. In particular, root mean square (RMS) RF (or other suitable type) detector 154 generates analog voltage signal 155 representing the power, magnitude, or amplitude of difference signal 151, and analog-to-digital converter (ADC) 158 digitizes analog voltage signal 155 to generate digital feedback signal 159. Not explicitly shown in FIGS. 1-3, but part of TX system 100 is a controller that controls the configuration of digital processor 110 and the states of switches 142a/b, 144a/b, and 148. In one implementation, such a controller is implemented within digital processor 110.

First TX Mode

As mentioned previously, FIG. 1 shows TX system 100 configured to operate in the first TX mode, where incoming data streams 101a/b are processed independently for independent transmission via antennas 150a/b, respectively. As represented in FIG. 1, in the first TX mode:

Digital processor 110 is configured such that (i) first incoming data signal 101a is applied directly as first outgoing data signal 119a and (ii) second incoming data signal 101b is applied directly as second outgoing data signal 119b;

First switch 142a is connected and configured such that first analog output signal 137a is applied to the first-switch input terminal 142a-C and presented at the first first-switch output terminal 142a-1;

Second switch 144a is connected and configured such that first analog output signal 137a presented at first first-switch output terminal 142a-1 is presented at second-switch output terminal 144a-C;

Third switch 142b is connected and configured such that second analog output signal 137b is applied to the third-switch input terminal 142b-C and presented at the first third-switch output terminal 142b-1; and Fourth switch 144b is connected and configured such that second analog output signal 137b presented at first third-switch output terminal 142b-1 is presented at fourth-switch output terminal 144b-C.

Note that, in the first TX mode, the configuration of fifth switch 148 is irrelevant, and feedback signal 159 generated by feedback path 152 is not used.

With this configuration, the signal transmitted via first antenna 150a is based on first incoming data stream 101a, but independent of second incoming data stream 101b, while the signal transmitted via second antenna 150b is based on second incoming data stream 101b, but independent of first incoming data stream 101a.

The configuration of switching sub-system 140 in FIG. 1 can provide increased isolation between the two transmit antennas 150a/b as compared to prior-art techniques such as those that rely solely on Butler matrices.

Second TX Mode

As mentioned previously, FIG. 2 shows TX system 100 configured to operate in the second TX mode, where incoming data streams 101a/b are combined for transmission via only first antenna 150a. As represented in FIG. 1, in the second TX mode:

Digital processor 110 is configured such that:
Summer 114 combines first and second incoming data streams 101a/b to form combined data stream 115;
Digital signal router 116 converts combined data stream 115 into two identical data streams 117a/b, each having all of the digital information of combined data stream 115 and each having a power level corresponding to half of the desired transmit power from first antenna 150a;
Based on digital feedback signal 159 from feedback path 152, first baseband adjuster 118a adjusts, as needed, one or more of the amplitude, phase, and delay of first half-power data stream 117a to generate first outgoing data stream 121a;
Similarly, based on digital feedback signal 159, second baseband adjuster 118b adjusts, as needed, one or more of the amplitude, phase, and delay of second half-power data stream 117b to generate second outgoing data stream 121b;
First switch 142a is connected and configured such that first analog output signal 137a is applied to the first-switch input terminal 142a-C and presented at the second first-switch output terminal 142a-2 and therefore at first input port 146-1 of combiner 146;
Third switch 142b is connected and configured such that second analog output signal 137b is applied to the third-switch input terminal 142b-C and presented at the second third-switch output terminal 142b-2 and therefore at second input port 146-2 of combiner 146;
Fifth switch 148 is connected and configured such that sum signal 147 generated by combiner 146 is applied to the input terminal 148-C of fifth switch 148 and presented at the second fifth-switch output terminal 148-2; and
Second switch 144a is connected and configured such that sum signal 147 is applied to the second second-switch input terminal 144a-2 and presented at the second-switch output terminal 144a-C.

Note that, in the second TX mode shown in FIG. 2, the configuration of fourth switch 144b ensures that the isolation between antenna 150a and antenna 150b is the combination of the isolation of switch 148 and the isolation of switch 144b.

With this configuration, the signal transmitted via first antenna 150a is based on both the first and second incoming data streams 101a/b, and no signal is transmitted via second antenna 150b.

Exemplary processing by first and second baseband adjusters 118a/b is described in U.S. Pat. No. 7,081,794, the teachings of which are incorporated herein by reference in their entirety. In one implementation, the phase and/or delay adjustments are made to reduce the magnitude of voltage signal 155, which thereby reduces phase differences between the two analog signals 137a/b combined by the combiner. Such phase matching advantageously reduces power loss due to destructive interference within combiner 146 and increases the power of the transmitted sum signal 147.

Although the figures show the phase and delay adjustments implemented in the digital domain within digital processor 110, other implementations are also possible. For example, in addition to or instead of one or both of these digital adjustments within digital processor 110, a voltage-controlled phase shifter and/or a voltage-controlled delay line could be implemented in the analog domain between the upconverter and the power amplifier in one or both transmission paths. In general, the voltage applied to such a phase shifter would be adjusted to minimize the magnitude of voltage signal 155 from detector 154, while the voltage applied to such a delay line would be adjusted such that the total analog delay of first TX path 122a is matched to the total analog delay of second TX path 122b to within pre-determined limits. Another technique for matching the delays is by means of meander lines that are adjusted manually during manufacture.

Third TX Mode

As mentioned previously, FIG. 3 shows TX system 100 configured to operate in the third TX mode, where incoming data streams 101a/b are combined for transmission via only second antenna 150b. As represented in FIG. 1, in the third TX mode:

Digital processor 110 and first and third switches 142a/b are configured and operate identically as in the second TX mode;

Fifth switch 148 is connected and configured such that sum signal 147 generated by combiner 146 is applied to the input terminal 148-C of fifth switch 148 and presented at the first fifth-switch output terminal 148-1; and Fourth switch 144b is connected and configured such that sum signal 147 is applied to the second fourth-switch input terminal 144b-2 and presented at the fourth-switch output terminal 144b-C.

Note that, in the third TX mode shown in FIG. 3, the configuration of third switch 144a ensures that the isolation between antenna 150a and antenna 150b is the combination of the isolation of switch 144a and the isolation of switch 148.

With this configuration, the signal transmitted via second antenna 150b is based on both the first and second incoming data streams 101a/b, and no signal is transmitted via first antenna 150a.

As in the second TX mode, in this third TX mode, phase matching between the two analog signals applied to combiner 146 advantageously reduces power loss due to destructive interference within combiner 146 and increases the power of the transmitted sum signal 147.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A reconfigurable wireless transmission system comprising:
    a digital processor adapted to receive at least first and second incoming data streams and generate at least first and second outgoing data streams;
    a first transmission path adapted to receive the first outgoing data stream and generate a first analog output signal;
    a second transmission path adapted to receive the second outgoing data stream and generate a second analog output signal;
    a switching sub-system that enables the system to be configured in any one of at least first and second transmission modes, wherein:
        in the first transmission mode, the first analog output signal is transmitted via a first antenna and the second analog output signal is transmitted via a second antenna; and in the second transmission mode, the first and second analog output signals are combined for transmission via the first antenna; and a feedback path connected to feed back a difference signal, corresponding to the first and second analog output signals, from the switching sub-system to the digital processor for use in controlling the second transmission mode.

2. The invention of claim 1, wherein the system is further configurable in a third transmission mode, in which the first and second analog output signals are combined for transmission via the second antenna.

3. The invention of claim 1, wherein the switching sub-system comprises:

a first switch having a first-switch input terminal connected to receive the first analog output signal and adapted to selectively apply the first analog output signal to either a first first-switch output terminal or a second first-switch output terminal;

a second switch having a first second-switch input terminal and a second second-switch input terminal and adapted to selectively apply an analog signal received at one of the first and second second-switch input terminals to a second-switch output terminal connected to the first antenna;

a third switch having a third-switch input terminal connected to receive the second analog output signal and adapted to selectively apply the second analog output signal to either a first third-switch output terminal or a second third-switch output terminal;

a fourth switch having a first fourth-switch input terminal and a second fourth-switch input terminal and adapted to selectively apply an analog signal received at one of the first and second fourth-switch input terminals to a fourth-switch output terminal connected to the second antenna;

a combiner having:
 a first combiner input port connected to the second first-switch output terminal;
 a second combiner input port connected to the second third-switch output terminal; and
 a sum output port, wherein the combiner is adapted to combine analog signals received at the first and second combiner input ports and present an analog sum signal at the sum output port; and a fifth switch having a fifth-switch input terminal connected to the first combiner output port and adapted to selectively present the analog sum signal at one of a first fifth-switch output terminal connected to the second fourth-switch input terminal and a second fifth-switch output terminal connected to the second second-switch input terminal.

4. The invention of claim 3, wherein the combiner is a 3dB quadrature hybrid.

5. The invention of claim 3, wherein:
the combiner further comprises a difference output port, wherein the combiner is adapted to difference the analog signals received at the first and second combiner input ports and present an analog difference signal at the difference output port; and
the feedback path is connected to receive and convert the analog difference signal into a digital feedback signal, wherein the digital processor is adapted to process the first and second incoming data streams based on the digital feedback signal.

6. The invention of claim 5, wherein the feedback path comprises:
a detector adapted to generate an analog voltage signal representative of power of the analog difference signal; and
an analog-to-digital converter (ADC) adapted to digitize the analog voltage signal to generate the digital feedback signal.

7. The invention of claim 1, wherein each of the first and second transmission paths comprises:
a digital-to-analog converter (DAC) adapted to convert the corresponding outgoing data stream into an analog baseband signal;
an upconverter adapted to upconvert the analog baseband signal to generate an analog radio-frequency (RF) signal;
a power amplifier adapted to amplify the analog RF signal to generate an amplified analog RF signal; and
a transmission filter adapted to filter the amplified analog RF signal to generate the corresponding analog output signal.

8. The invention of claim 1, wherein:
in the first transmission mode:
 the digital processor generates the first outgoing data stream based on the first incoming data stream, but independent of the second incoming data stream; and
 the digital processor generates the second outgoing data stream based on the second incoming data stream, but independent of the first incoming data stream; and
in the second transmission mode:
 the digital processor (i) combines the first and second incoming data streams to generate a combined data stream and (ii) generates both of the first and second outgoing data streams based on the combined data stream.

9. The invention of claim 8, wherein, in the second transmission mode:
the digital processor adjusts at least one of phase and delay of a first version of the combined data stream to generate the first outgoing data stream; and
the digital processor adjusts at least one of phase and delay of a second version of the combined data stream to generate the second outgoing data stream.

10. The invention of claim 9, wherein, in the second transmission mode, the digital processor adjusts the phase of the first and second versions of the combined data stream to reduce phase differences between the two analog signals combined by the combiner.

11. The invention of claim 9, wherein, in the second transmission mode, the digital processor adjusts amplitude of the first and second versions of the combined data stream to generate the first and second outgoing data streams.

12. The invention of claim 9, wherein, in the second transmission mode, the digital processor adjusts the at least one of phase and delay of the first and second versions of the combined data stream to generate the first and second outgoing data streams based on a digital feedback signal generated by a feedback path connected to the switching sub-system.

13. The invention of claim 1, wherein the switching sub-system provides isolation such that, during the first transmission mode:
substantially none of the first analog output signal is transmitted via the second antenna; and
substantially none of the second analog output signal is transmitted via the first antenna.

14. A wireless transmission method comprising:
receiving at least first and second incoming data streams and generating at least first and second outgoing data streams;

receiving the first outgoing data stream and generating a first analog output signal;
receiving the second outgoing data stream and generating a second analog output signal;
selectively performing the method in any one of at least first and second transmission modes, wherein:
in the first transmission mode, the first analog output signal is transmitted via a first antenna and the second analog output signal is transmitted via a second antenna; and
in the second transmission mode, the first and second analog output signals are combined for transmission via the first antenna; and
feeding back a difference signal, corresponding to the first and second analog output signals, for use in controlling the second transmission mode.

15. A reconfigurable wireless transmission system comprising:
a digital processor adapted to receive at least first and second incoming data streams and generate at least first and second outgoing data streams;
a first transmission path adapted to receive the first outgoing data stream and generate a first analog output signal;
a second transmission path adapted to receive the second outgoing data stream and generate a second analog output signal;
a switching sub-system that enables the system to be configured in any one of at least first and second transmission modes, wherein:
in the first transmission mode, the first analog output signal is transmitted via a first antenna and the second analog output signal is transmitted via a second antenna;
in the second transmission mode, the first and second analog output signals are combined for transmission via the first antenna; and
the switching sub-system comprises:
a first switch having a first-switch input terminal connected to receive the first analog output signal and adapted to selectively apply the first analog output signal to either a first first-switch output terminal or a second first-switch output terminal;
a second switch having a first second-switch input terminal and a second second-switch input terminal and adapted to selectively apply an analog signal received at one of the first and second second-switch input terminals to a second-switch output terminal connected to the first antenna;
a third switch having a third-switch input terminal connected to receive the second analog output signal and adapted to selectively apply the second analog output signal to either a first third-switch output terminal or a second third-switch output terminal;
a fourth switch having a first fourth-switch input terminal and a second fourth-switch input terminal and adapted to selectively apply an analog signal received at one of the first and second fourth-switch input terminals to a fourth-switch output terminal connected to the second antenna;
a combiner having:
a first combiner input port connected to the second first-switch output terminal;
a second combiner input port connected to the second third-switch output terminal; and
a sum output port, wherein the combiner is adapted to combine analog signals received at the first and second combiner input ports and present an analog sum signal at the sum output port; and
a fifth switch having a fifth-switch input terminal connected to the first combiner output port and adapted to selectively present the analog sum signal at one of a first fifth-switch output terminal connected to the second fourth-switch input terminal and a second fifth-switch output terminal connected to the second second-switch input terminal.

16. The invention of claim 15, wherein the combiner is a 3 dB quadrature hybrid.

17. The invention of claim 15, wherein:
the combiner further comprises a difference output port, wherein the combiner is adapted to difference the analog signals received at the first and second combiner input ports and present an analog difference signal at the difference output port; and
the system further comprises a feedback path connected to receive and convert the analog difference signal into a digital feedback signal, wherein the digital processor is adapted to process the first and second incoming data streams based on the digital feedback signal.

18. The invention of claim 17, wherein the feedback path comprises:
a detector adapted to generate an analog voltage signal representative of power of the analog difference signal; and
an analog-to-digital converter (ADC) adapted to digitize the analog voltage signal to generate the digital feedback signal.

19. A reconfigurable wireless transmission system comprising:
a digital processor adapted to receive at least first and second incoming data streams and generate at least first and second outgoing data streams;
a first transmission path adapted to receive the first outgoing data stream and generate a first analog output signal;
a second transmission path adapted to receive the second outgoing data stream and generate a second analog output signal;
a switching sub-system that enables the system to be configured in any one of at least first and second transmission modes, wherein:
in the first transmission mode, the first analog output signal is transmitted via a first antenna and the second analog output signal is transmitted via a second antenna;
in the second transmission mode, the first and second analog output signals are combined for transmission via the first antenna;
in the first transmission mode:
the digital processor generates the first outgoing data stream based on the first incoming data stream, but independent of the second incoming data stream; and
the digital processor generates the second outgoing data stream based on the second incoming data stream, but independent of the first incoming data stream; and
in the second transmission mode:
the digital processor (i) combines the first and second incoming data streams to generate a combined data stream and (ii) generates both of the first and second outgoing data streams based on the combined data stream.

20. The invention of claim 19, wherein, in the second transmission mode:
the digital processor adjusts at least one of phase and delay of a first version of the combined data stream to generate the first outgoing data stream; and
the digital processor adjusts at least one of phase and delay of a second version of the combined data stream to generate the second outgoing data stream.

21. The invention of claim 20, wherein, in the second transmission mode, the digital processor adjusts the phase of the first and second versions of the combined data stream to reduce phase differences between the two analog signals combined by the combiner.

22. The invention of claim 20, wherein, in the second transmission mode, the digital processor adjusts amplitude of the first and second versions of the combined data stream to generate the first and second outgoing data streams.

23. The invention of claim 20, wherein, in the second transmission mode, the digital processor adjusts the at least one of phase and delay of the first and second versions of the combined data stream to generate the first and second outgoing data streams based on a digital feedback signal generated by a feedback path connected to the switching sub-system.

* * * * *